(12) United States Patent
Davis

(10) Patent No.: US 7,058,109 B2
(45) Date of Patent: Jun. 6, 2006

(54) IMAGE AMPLIFICATION FOR LASER SYSTEMS

(75) Inventor: Peter Eric Davis, Adelaide (AU)

(73) Assignee: Norseld Pty LTD, Adelaide (AU)

(*) Notice: Subject to any disclaimer, the term of this patent is extended or adjusted under 35 U.S.C. 154(b) by 354 days.

(21) Appl. No.: 10/468,345

(22) PCT Filed: Feb. 22, 2002

(86) PCT No.: PCT/AU02/00192

§ 371 (c)(1),
(2), (4) Date: Aug. 18, 2003

(87) PCT Pub. No.: WO02/067057

PCT Pub. Date: Aug. 29, 2002

(65) Prior Publication Data

US 2004/0085436 A1    May 6, 2004

(30) Foreign Application Priority Data

Feb. 22, 2001  (AU) .................................. PR3234

(51) Int. Cl.
*H01S 3/22*    (2006.01)
*H01S 3/00*    (2006.01)

(52) U.S. Cl. ........................................ 372/56; 359/333

(58) Field of Classification Search ............ 372/55–56; 359/333
See application file for complete search history.

(56) References Cited

U.S. PATENT DOCUMENTS

| | | | | |
|---|---|---|---|---|
| 3,786,366 A | * | 1/1974 | Chimenti et al. | 372/1 |
| 3,876,281 A | * | 4/1975 | Chimenti et al. | 359/27 |
| 3,876,366 A | * | 4/1975 | Corte | 431/254 |
| 4,796,038 A | | 1/1989 | Allen et al. | |
| 4,920,541 A | * | 4/1990 | Baumgartner et al. | 372/23 |
| 5,109,149 A | * | 4/1992 | Leung | 219/121.69 |
| 5,475,527 A | * | 12/1995 | Hackel et al. | 359/334 |
| 5,574,576 A | * | 11/1996 | Martin | 358/484 |
| 5,744,780 A | * | 4/1998 | Chang et al. | 219/121.73 |
| 6,057,525 A | * | 5/2000 | Chang et al. | 219/121.73 |
| 6,472,295 B1 | * | 10/2002 | Morris et al. | 438/463 |
| 6,717,101 B1 | * | 4/2004 | Morris et al. | 219/121.67 |

FOREIGN PATENT DOCUMENTS

EP    1 162 509 A2    12/2001

* cited by examiner

*Primary Examiner*—Minsun Oh Harvey
*Assistant Examiner*—Phillip Nguyen
(74) *Attorney, Agent, or Firm*—Squire, Sanders & Dempsey

(57) ABSTRACT

An optical image amplifier comprising a copper bromide laser (10) to provide a source of optical radiation, an optical amplifier (18) for amplifying the optical radiation received from the laser (10), an optical image forming device (16) located intermediate the laser (10) and optical amplifier (18) for forming an image to spatially modulate the output of the laser (10), and optical focusing means (22) located at the output of the optical amplifier for translating the image or a portion thereof to a surface to be illuminated (30). The system increases the efficiency of irradiation of photosensitive films, used for example in the manufacture of integrated circuits and printed circuit boards using laser direct imaging.

7 Claims, 3 Drawing Sheets

IMAGE AMPLIFICATION FOR LASER SYSTEMS

This invention relates to the intensity amplification of images and in particular the use of copper bromide lasers to do so. In one particular embodiment such an arrangement is useable for laser direct imaging.

BACKGROUND

The science of laser amplification is known and a multitude of scientific uses exists for such devices and in the industrial/commercial arena (optical fibre laser transmission for communications etc).

Use of lasers and in particular metal vapour and copper bromide lasers is also known, their use being equally diverse in the scientific industrial/commercial and medical fields.

Copper bromide lasers are additionally known for their very high optical brightness gain (approx 10,000).

One application that appears particularly suitable for the use of a laser occurs in the relatively new field of Laser Direct Imaging (LDI).

Forming an image on a photo sensitive film referred to generally as photo-lithography. It is commonly employed to expose patterns via a mask on to devices such as integrated circuits, integrated circuit masks, flat panel displays and printed circuit boards as well as application in the printing industry.

A conventional photolithographic process begins with the coating of a work piece with a layer of photo-resist. Selected regions of the photo-resist are acted upon by light shone (typically Ultra Violet (UV)) through the prepared film or mask inducing a chemical reaction in the photoresist. Either the illuminated regions or the non-illuminated regions (depending on the type of photo resist used) are then removed by a chemical process to leave a patterned layer covering the portion of the surface of the device that is to remain after further chemical processing to remove the uncovered layer portion.

The device is then subjected to a chemical process, such as etching to remove the uncovered portions of the upper layer of the work piece.

The photo chemical resistive layer is then cleaned off the device and tracks, pads, via hole surrounds and the like remain on the surface of the device.

A laser scanner is another device that can be used to expose light on to a surface. A scanner can position with great precision one or more focused and intensity modulated laser beams as a series of scan lines over an area of a work piece being patterned. That precision depends on the sharpness of the focus of the laser beam, the accuracy of modulation of the laser beam, the precision with which the laser beam moves across the layer being patterned and the synchronisation between the modulation and movement of the laser beam. The power of the laser will affect the photoresist accordingly. Essentially prior arrangements are a pixel by pixel serial scanning arrangement.

FIG. 1 shows an example of a prior art arrangement of a Laser Direct Imaging (LDI) system used for illuminating a printed circuit board. In this prior art example, an ultraviolet (UV) argon-ion laser system is coupled into an Acousto-Optical Modulator (AOM) where the continuous wave laser beam is in effect switched on and off (time modulated) in a manner determined by rasterized data supplied from a computer. The now modulated laser light passes through various lenses and is directed via mirrors, to a scanning arrangement. In the prior art example, scanning motion is realised through the use of a rotating "polygon". The polygon is a multi-faced rotating mirror assembly and its speed of rotation together with the available laser power determines the energy available for photochemical changes to affect the photoresist coating on the surface of the work piece. After each linear scan, the board moves to the next row of a predetermined array of linear scans.

The faster the photo sensitive resist reacts to illumination, the faster the polygon can rotate and the shorter will be the time it takes to illuminate a line and thus a work piece. Thus the sensitivity of reaction of the resists, the polygon and AOM speed and laser output power become major factors in determining the productivity of prior art laser direct imaging systems using available photo sensitive resists.

It is possible to split the beam into multiple paths so as to expose the board along multiple lines or locations to further increase productivity.

The various optical systems used to deflect and manipulate the laser beam from its original output path through the system include reflective and refractive elements.

At present it seems that no significant improvement in laser powers at wave lengths below 532 nm can be seen in the near future thus most effort is being put into developing high sensitivity, dry UV resists having 10 mJ/cm$^2$ or greater sensitivity. However, even this figure is only achieved in special formulations that are expensive, have short shelf life and a low contrast ratio. Exposure times become critical but increasing exposure periods will lead to lower productivity.

All this must occur with the highest possible work piece throughput and minimal material wastage and defects. Finding a suitable combination of laser frequency, power, resists and working rate that matches all of the above characteristics is the challenge at hand for LDI systems designers.

As will therefore become apparent, the LDI area is ripe for LDI apparatus that can provide a large number (many thousands) of pixels in a parallel rather than a serial format. An amplification system as proposed herein will assist in this regard. However, it should be noted that the LDI application described in detail herein is an example only, and other applications for image amplification are not excluded from the scope of the invention generally disclosed herein.

BRIEF DESCRIPTION OF THE INVENTION

An optical image amplifier consisting of:
- an optical radiation source consisting of an operating copper bromide laser tube having a laser output;
- an optical amplifier spaced from said optical radiation source orientated so as to receive an output from said optical radiation source;
- an active optical transmission or reflective image forming device located intermediate said optical radiation source and said optical amplifier by which an image can be formed to spatially modulate the laser output; and
- an optical focusing means located at the output of said optical amplifier for translating said image or a portion thereof to a surface to be illuminated.

In an aspect of the invention the object to be illuminated is a printed circuit board blank covered with a photo resist sensitive to said laser output.

In another aspect of the invention said optical focussing means produces an array of pixels, at least one pixel wide, representing at least a portion of said image.

In a further aspect of this invention said optical focussing means produces an area of radiation representative of a portion of said image.

In another aspect of the invention said active optical image forming device is a computer controlled liquid crystal array.

In yet a further aspect of the invention green or yellow radiation output from the optical amplifier is frequency doubled to produce UV radiation.

The specific embodiments of the invention will now be described in some further detail with reference to and as illustrated in the accompanying figures. These embodiments are illustrative, and are not meant to be restrictive of the scope of the invention. Suggestions and descriptions of other embodiments may be included within the scope of the invention but they may not be illustrated in the accompanying figures or alternatively features of the invention may be shown in the figures but not described in the specification.

DETAILED DESCRIPTION OF EMBODIMENTS OF THE INVENTION

Figure 1:
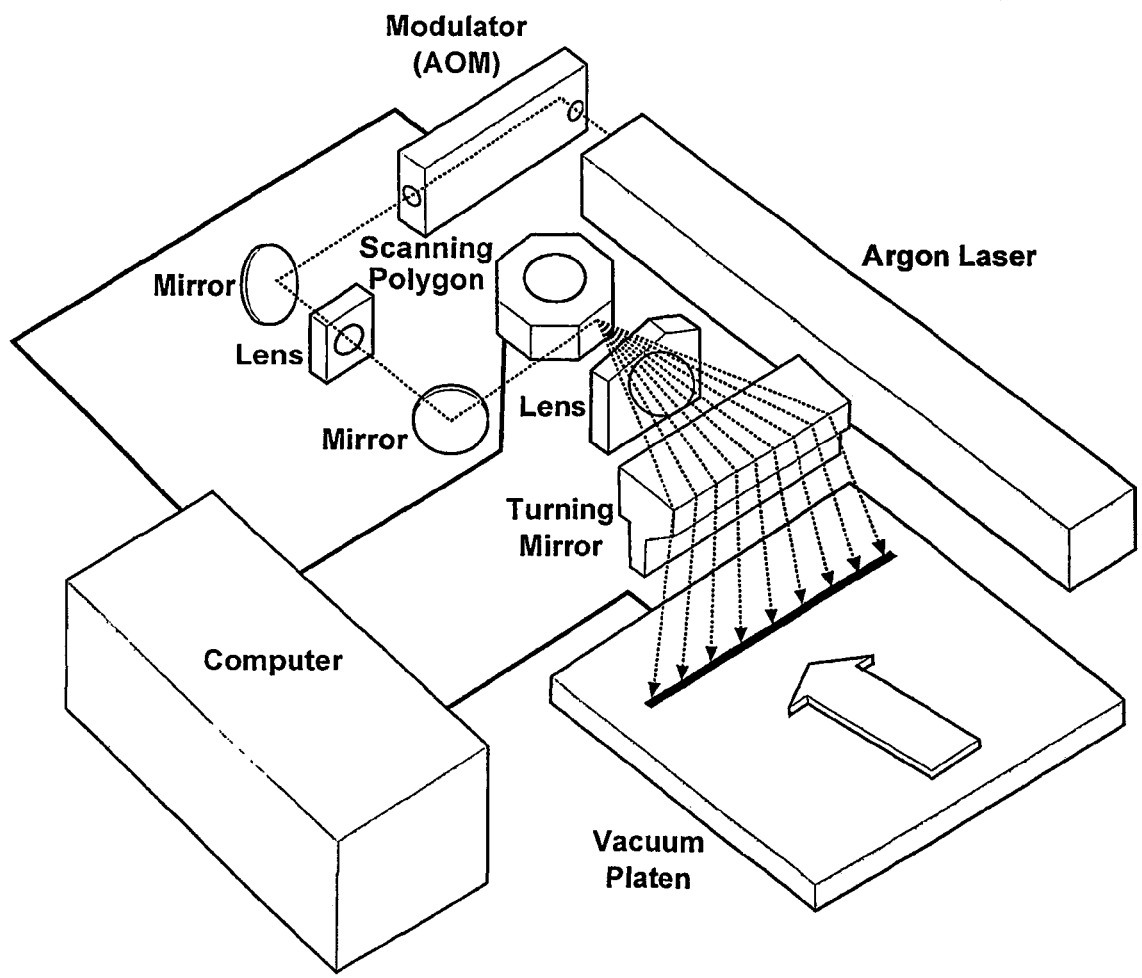
FIG. 1 is an illustration of a prior art arrangement of a laser direct imaging system.
Figure 2:
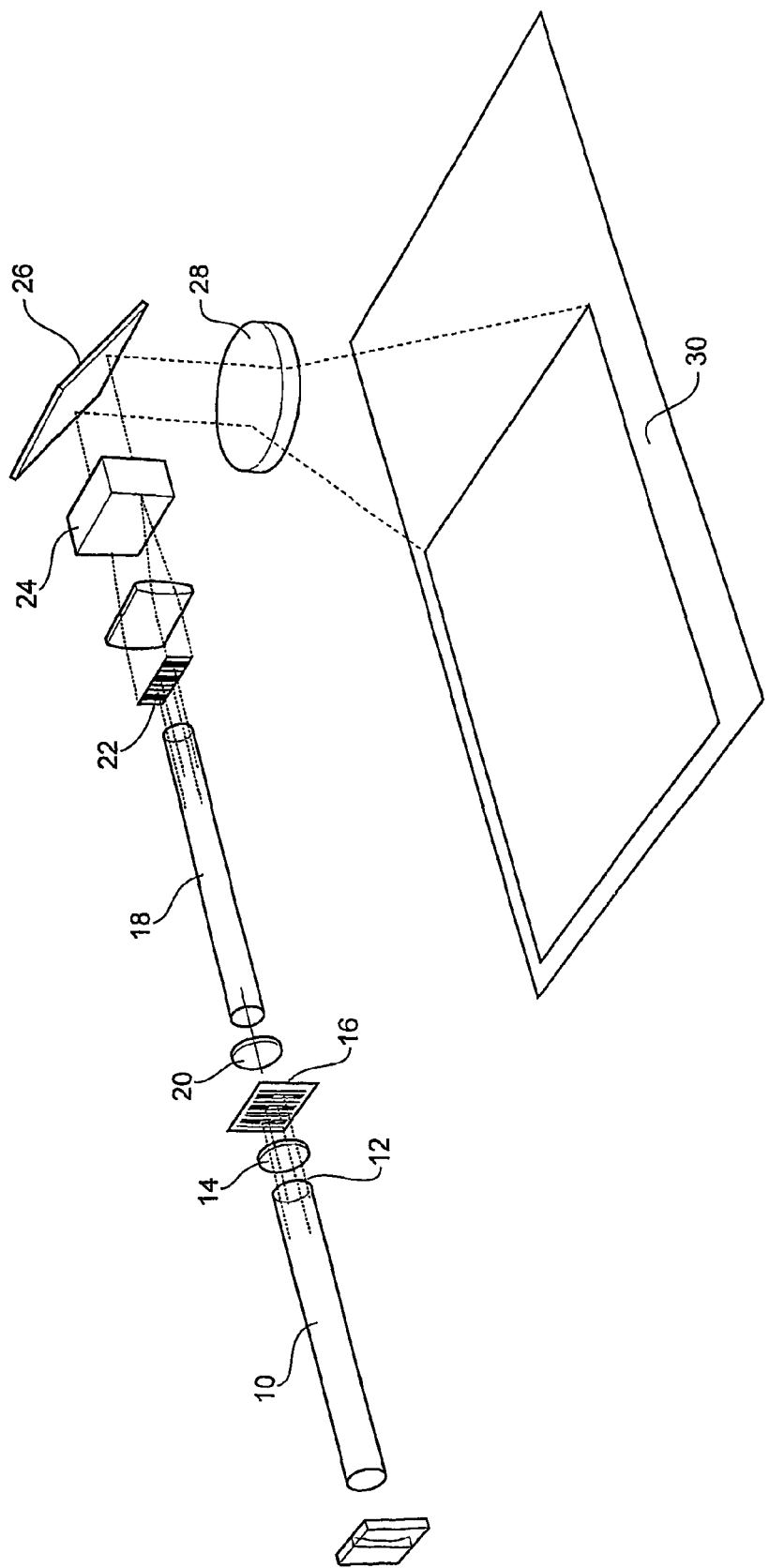
FIG. 2 is the schematic of one embodiment of a laser imaging system incorporating one embodiment of the amplification system for increasing the intensity of an image.

In an embodiment of the invention a copper bromide (CuBr) laser is used as the oscillator 10, as is pictorially represented in FIG. 2. Such lasers are known for their relatively high power and excellent beam quality, and very high optical gain.

However, in this embodiment of the invention a relatively low power output is only needed to be generated at 12 and directed to an optical system 14 that further adapts the laser output to illuminate the active area of the image forming device. The components and their arrangement in this part of the apparatus are well known to those skilled in the art.

The wavelength of the copper bromide laser output is 511 nm and 578 nm (a green and yellow laser) and can be designed to give low power (<5.5 Watts) which is ideal because it will not destroy or distort the image modulation device 16. The spatially modulated beam now in the form of a partial image of the printed circuit board feature information is now collimated by the optical system 20 and amplified by the second laser tube 18 to form a high power image containing many thousands of pixels of information each with enough energy to "expose" the printed circuit board and initiate the desired chemical reaction.

It is thought to be the dearly novel aspect of this invention that the image formation medium is positioned at the output of a relatively low power laser source so as to spatially modulate its output. An optical amplifier 18 is then used to increase the modulated image intensity. The path of the radiation after passing through the image formation medium is imaged into the amplifier 20. The components and their arrangement in this part of the apparatus are well known to those skilled in the art. Such an arrangement is typically reflective and not refractive as pictorially represented in FIG. 2.

It should be noted that the use of LDI as an application is merely illustrative of the useful combination consisting of a low power laser, dynamic image modulation device and optical amplifier that represents the invention. The advantage such a combination provides in an LDI environment is a good illustration but other or similar advantages in different environments and other applications will be readily apparent.

The dynamic image device is preferably at this time, a Liquid Crystal Display (LCD) that is arranged to display a pattern which modulates the passing laser light, by allowing or not allowing, the transmission of the low power laser light through it. The resolution of the image is determined not only by the laser divergence but is also determined by the element size of the LCD display.

An LCD is but one example of a suitable dynamic display device and since they can be relatively slow, alternative is a micro-mirror array or any other device capable of spatial modulation to generate a pixel array. Alternatively a variant of an acousto-optical modulator could be used as well. Different devices will suit different arrangements and applications.

The dynamic nature of the image generation device is important not only for the changeable nature of the images but the rate at which it can be changed. In the example, illustrated in FIG. 2 the printed circuit board 30 is to be irradiated with laser light of sufficient intensity to induce a photo chemical reaction in a resist applied to the surface of the printed circuit board.

The rate of scrolling must be in concert with the rate at which the image on the dynamic image generation device is being displayed that is used to modulate the laser output from the CuBr laser.

Figure 3:
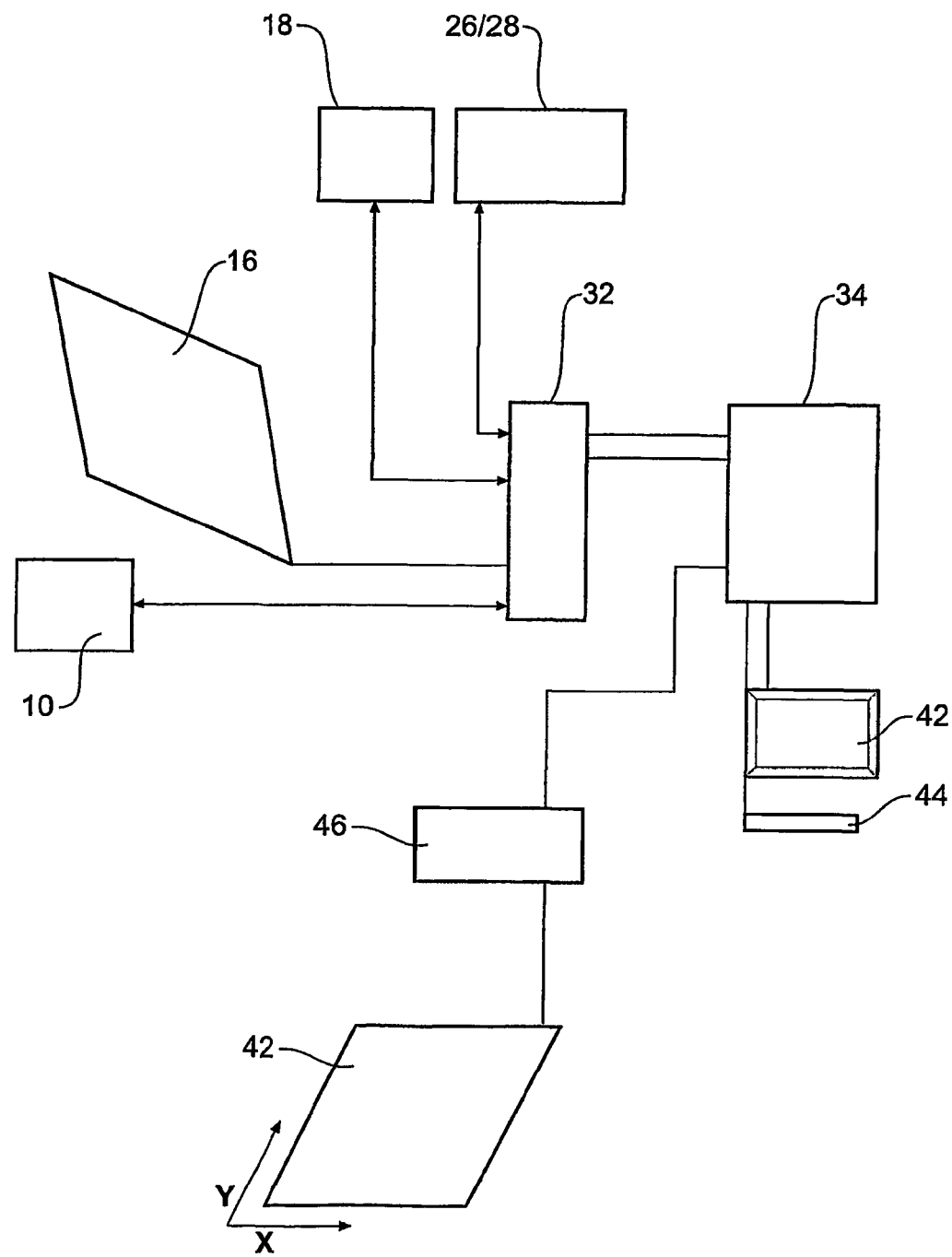
FIG. 3 is a schematic block diagram of the control electronics for the embodiment disclosed in FIG. 2.

A control circuit shown in functional block diagram form in FIG. 3 achieves in but one embodiment, control of this rate. The details of this figure will be described later in the specification.

It can be noted that in prior LDI systems, it is typical for the irradiation of an image to be achieved pixel by pixel or a row of pixels at a time. With the proposed arrangement, it will be possible to dramatically decrease the time it takes to irradiate each PCB thus increasing the PCB rate of manufacture because it will be possible to project many thousands of pixels on to the PCB at each laser pulse.

It will also be possible, but it is not illustrated in FIG. 2, to illuminate an area of the PCB. It is envisaged that an array of areas over the PCB surface can be reproduced on the image device so that when the PCB board is moved in a suitable X-Y pattern it will ensure that the appropriate areas are illuminated and accurately aligned with adjacent areas.

The embodiment disclosed in FIG. 2 shows that an optical amplifier 18, which is part of the system commonly referred to as a Master Optical Power Amplifier (MOPA), used to amplify laser radiation. It is only preferable to use such a device in the embodiment. The MOPA oscillator produces high quality illumination of the modulation device the output from the modulating device (many thousands of pixels) is then amplified by the amplifier tube (18) the brightness amplification is typically ten thousand times.

Furthermore in this embodiment, an optical system is shown at the location of the output of the MOPA. This arrangement is but one example of an arrangement suitable to manipulate the image into a shape preferable for projection on to a printed circuit board while meeting the mJ/cm$^2$ exposure requirement and wave length of the chosen resist.

It is not inconceivable that either visible photo sensitive or UV sensitive resists could be used, as the requisite power is available for either to be used.

In the embodiment shown in FIG. 2, the amplified image is pictorially represented at 19 entering a cylindrical refractive lens 22 which will reduce an area having 2 dimensional information into a line image of one dimension, although it is not anticipated that the second 2 dimensional information will be lost.

In this embodiment a frequency doubler element 24 is used which is also known as a Second Harmonic Generator (SHG). This non-linear device will output image information at twice the frequency and provide a modulated laser signal at UV frequencies. Using UV frequencies makes it possible to use conventional and cheaper resists.

However, it should be noted that the SHG has low efficiency, in the vicinity of 20 to 30 percent, so that increased power generated in the optical amplifier may be required if the power budget of the overall device is to balance and eventually provide for an output radiation intensity of the required mJ/cm$^2$.

It is however possible to do without an SHG and use just the visible laser light output from the optical amplifier. After some suitable optical manipulation and appropriate choice of resist, the task of illuminating a PCB to create a track pattern can still be achieved. For example, typical resists are monomer and UV would be used to polymerize the resist to create a polymer. One disadvantage of such resists is that polymers are long chain structures and their length can affect the smallest size of structure created on the work piece. Thus use of UV laser energy can have limitations if certain resists are used. Whereas, use of visible laser light may provide a reason to develop a resist that has a photo-initiator suitable for 511 nm and of 578 nm at the increased power levels obtainable by using an optical amplifier.

The pictorial representation provided in FIG. 2 is but one simple example of a means to disperse the image data over the width of a PCB. In this embodiment the arrangement comprises a planar mirror 26 and a spreader/dispersion optical element 28 to form a line image.

It is also possible to arrange an appropriately curved mirror or mirrors to change the direction while correcting aberrations and the like before it is projected onto the printed circuit board.

Not shown is a further version of suitable optics that can be arranged to irradiate a rectangular or square area of the PCB. Co-ordination of movement of the resist covered PCB with the dynamic image device is again controlled by a functional circuit not unlike that shown in FIG. 3.

It is understood that the line and space specifications will likely be in the low micron range and that the generous power budget of the arrangement will allow the use of a larger range of resists which will importantly likely be less expensive and more stable overall allowing for the further reduction of costs of PCB manufacture.

The ability to feed in and project large numbers of pixels (200Mpixels per second) in the form of a linear array and to move them swathe like over the area of the PCB results directly from the use of a high quality CuBr laser source and CuBr amplifier used in conjunction with a dynamic image generator that overall produces sufficient energy to initiate a reaction in the chosen resist.

The relatively high power of the visible or UV radiation output will allow for faster irradiation times providing an improvement over conventional systems in relation to the number of boards that can be irradiated per hour.

FIG. 3 depicts a pictorial representation of a functional block diagram for the control aspects of an LDI apparatus. The electronics and computer elements of the controller are known in the art so detailed discussions as to their workings is unnecessary. There are many different ways to implement such a controller and in the anticipated case of very high throughput equipment, dedicated integrated circuits designed for extremely high data throughput (e.g. as mentioned previously as much if not more than 200 Mpixels per second data rate) will likely need to be developed.

The following description is very generic and used for illustrative purposes only. The laser oscillator 10, dynamic image device 16, the optical amplifier 18, and dispersion optics are controlled via an interface circuit 32. These devices also provide data about their operation via the interface circuit to the Central Processing Unit (CPU) 34. Interface circuit 32 is itself controlled by data from a Personal Computer (PC) 34.

User interface devices comprising a screen 42 and a keyboard 44 are interfaced to the PC via normal means to control the program to be used however the apparatus can operate autonomously.

Control of the PCB movement can at its simplest level be achieved by using a conventional X-Y motion system approach. An X-Y motion control interface 46 is instructed via a bus or communication protocol by the CPU and controls an X-Y motion system to achieve accurate movement of the PCB in concert with the image being provided to the image display device 16.

Registration of the image to the board dimensions during the irradiation process is critical and different means and methods to address this issue are many and varied and well known in the art.

It will be appreciated by those skilled in the art that the invention is not restrictive in its use to the particular application described neither is the present invention restricted in its preferred embodiment with regard to the particular elements and/or features described or depicted herein. It will be appreciated that various modifications can be made without departing from the principles of the invention.

Therefore, the invention should be understood to include all such modifications within its scope.

The claims defining the invention are as follows:

1. An optical image amplifier consisting of:
   an optical radiation source consisting of an operating copper bromide laser tube having a laser output;
   an optical amplifier spaced from said optical radiation source orientated so as to receive an output from said optical radiation source;
   an active optical transmission or reflective image forming device located intermediate said optical radiation source and said optical amplifier by which an image can be formed to spatially modulate the laser output; and
   an optical focusing means located at the output of said optical amplifier for translating said image or a portion thereof to a surface to be illuminated.

2. An optical image amplifier according to claim 1 wherein the object to be illuminated is a printed circuit board blank covered with a photo resist sensitive to said laser output.

3. An optical image amplifier according to claim 1 wherein said optical focussing means produces an array of pixels, at least one pixel wide, representing at least a portion of said image.

4. An optical image amplifier according to claim 1 wherein said optical focussing means produces an area of radiation representative of a portion of said image.

5. An optical image amplifier according to claim 1 wherein said active optical image forming device is a computer controlled liquid crystal array.

6. An optical image amplifier according to claim 1 wherein said active optical image forming device is a computer controlled micro-mirror array.

7. An optical image amplifier according to claim 1 wherein green or yellow radiation output from the optical amplifier is frequency doubled to produce an image array in the UV spectrum.

* * * * *